United States Patent
Ogihara

(10) Patent No.: US 9,906,060 B2
(45) Date of Patent: Feb. 27, 2018

(54) CONTROL DEVICE AND CONTROL METHOD FOR A SECONDARY BATTERY

(71) Applicant: NISSAN MOTOR CO., LTD., Yokohama-Shi, Kanagawa (JP)

(72) Inventor: Wataru Ogihara, Kanagawa (JP)

(73) Assignee: Nissan Motor Co., Ltd., Yokohama-Shi, Kanagawa (JP)

( * ) Notice: Subject to any disclaimer, the term of this patent is extended or adjusted under 35 U.S.C. 154(b) by 89 days.

(21) Appl. No.: 14/916,885

(22) PCT Filed: Jul. 9, 2014

(86) PCT No.: PCT/JP2014/068334
§ 371 (c)(1),
(2) Date: Mar. 4, 2016

(87) PCT Pub. No.: WO2015/033665
PCT Pub. Date: Mar. 12, 2015

(65) Prior Publication Data
US 2016/0218544 A1    Jul. 28, 2016

(30) Foreign Application Priority Data
Sep. 6, 2013    (JP) .................. 2013-184878

(51) Int. Cl.
*H02J 7/00* (2006.01)
*H01M 4/505* (2010.01)
(Continued)

(52) U.S. Cl.
CPC ......... *H02J 7/0068* (2013.01); *B60L 11/1851* (2013.01); *B60L 11/1861* (2013.01);
(Continued)

(58) Field of Classification Search
CPC . H02J 7/0068; B60L 11/1851; B60L 11/1861; G01R 31/361
(Continued)

(56) References Cited

U.S. PATENT DOCUMENTS

2003/0108793 A1    6/2003  Dahn et al.
2006/0159994 A1    7/2006  Dahn et al.
(Continued)

FOREIGN PATENT DOCUMENTS

JP    2004538610 A    12/2004
JP    2011135657 A    7/2011
(Continued)

*Primary Examiner* — Nathaniel Pelton
*Assistant Examiner* — Johali Torres Ruiz
(74) *Attorney, Agent, or Firm* — Young Basile Hanlon & MacFarlane, P.C.

(57) ABSTRACT

A control device for a secondary battery using positive electrode active material made of solid solution material, comprising: a voltage detecting unit configured to detect an actual open circuit voltage value; an SOC detecting unit configured to detect an actual state of charge value on a basis of the actual open circuit voltage value and/or an actual current value; a memory unit configured to store a voltage-SOC standard control curve which shows a relation between an open circuit voltage value and a state of charge value; a presumed voltage calculating unit configured to calculate a presumed voltage value on the basis of the actual state of charge value and the voltage-SOC standard control curve stored in the memory unit; a determining unit configured to determine sameness between the actual voltage value detected by the voltage detecting unit and the presumed voltage value calculated by the presumed voltage calculating unit.

12 Claims, 10 Drawing Sheets

(51) Int. Cl.
*H01M 4/525* (2010.01)
*H01M 10/48* (2006.01)
*H02J 7/04* (2006.01)
*B60L 11/18* (2006.01)
*H01M 10/0525* (2010.01)
*G01R 31/36* (2006.01)
*H01M 10/42* (2006.01)
*H01M 10/44* (2006.01)

(52) U.S. Cl.
CPC ......... *G01R 31/361* (2013.01); *G01R 31/362* (2013.01); *G01R 31/3648* (2013.01); *H01M 4/505* (2013.01); *H01M 4/525* (2013.01); *H01M 10/0525* (2013.01); *H01M 10/425* (2013.01); *H01M 10/44* (2013.01); *H01M 10/48* (2013.01); *H02J 7/00* (2013.01); *H02J 7/04* (2013.01); *H01M 2010/4271* (2013.01); *H01M 2220/20* (2013.01); *Y02E 60/122* (2013.01); *Y02T 10/7011* (2013.01)

(58) Field of Classification Search
USPC .................................. 320/134; 324/429, 433
See application file for complete search history.

(56) References Cited

U.S. PATENT DOCUMENTS

| | | |
|---|---|---|
| 2008/0180062 A1* | 7/2008 | Okumura ............. G01R 31/361 320/134 |
| 2009/0208824 A1 | 8/2009 | Greening et al. |
| 2009/0325056 A1 | 12/2009 | Greening et al. |
| 2010/0023285 A1* | 1/2010 | Nakanishi ............. G01R 31/362 702/63 |
| 2010/0156351 A1* | 6/2010 | Ugaji ................. G01R 31/3679 320/132 |
| 2011/0148361 A1 | 6/2011 | Yokotani |
| 2012/0176098 A1 | 7/2012 | Greening et al. |
| 2012/0274331 A1 | 11/2012 | Liu et al. |
| 2013/0138370 A1* | 5/2013 | Oh ..................... G01R 31/3624 702/63 |
| 2013/0165796 A1 | 6/2013 | Tashiro |
| 2014/0356718 A1 | 12/2014 | Ito et al. |

FOREIGN PATENT DOCUMENTS

| | | |
|---|---|---|
| JP | 2012075866 A | 4/2012 |
| KR | 20130060622 A | 6/2013 |
| WO | 2013115390 A1 | 8/2013 |

* cited by examiner

STEP 1 Mn AND Ni ELUTE DURING HIGH-VOLTAGE CHARGE

STEP 2 ELUTED Mn AND Ni IONS ARE ELECTRODEPOSITED ONTO NEGATIVE ELECTRODE

DUE TO HIGHER DEPOSITION POTENTIAL IN Mn AND Ni IONS THAN Li IONS

STEP 3 ELECTRODEPOSITED Mn AND Ni DECOMPOSE
ELECTROLYTE AND ITS DECOMPOSED PRODUCT DEPOSITS
ONTO NEGATIVE ELECTRODE

ENERGY LOSSES OCCUR BECAUSE DECOMPOSITION REACTION USES
ENERGY

STEP 4 DEPOSITS DISTURBS $Li^+$ MOVEMENT ⇒ HIGH-
RESISTIVITY ENHANCES DETERIORATION

CONTROL DEVICE AND CONTROL METHOD FOR A SECONDARY BATTERY

CROSS REFERENCE TO RELATED APPLICATION

The present application claims priority to Japanese Patent Application No. 2013-184878 filed on Sep. 6, 2013, incorporated by reference in its entirety.

TECHNICAL FIELD

The present invention relates to a control device and a control method for such as charge and discharge of a secondary battery.

BACKGROUND

For a secondary battery such as a lithium secondary battery, positive electrode active material made of solid solution material such as $Li_y[M^1_{(1-b)}Mn_b]O_2$ or $Li_y[M^1_{(1-b)}Mn_b]O_{1.5+c}$ ($M^1$ is a metallic element) has been studied with an aim of achieving high capacity (See JP 2004-538610).

However, in a secondary battery using positive electrode active material made of the above solid solution material, when charge and discharge is repeated, it becomes difficult for lithium (Li) to return back to positive electrode active material due to diffusion control at the end of its discharge life, thus complete discharge cannot be performed. For this reason, even when a state of charge (SOC) is determined by measuring the actual battery voltage, it may greatly differ from the actual state of charge. Accordingly, there is a problem that the secondary battery cannot be controlled accurately.

SUMMARY

A problem to be solved by the present invention is to provide a control device and control method for a secondary battery that enables accurate control of the secondary battery.

To solve the above problem, for a secondary battery that uses positive electrode active material made of solid solution material, a presumed voltage value is extracted from a voltage-SOC standard control curve which is acquired in advance based on the state of charge values determined from an actual voltage value or an actual current value of the secondary battery. Then, a difference between the actual voltage value and the presumed voltage value is determined in this invention.

In this invention, a state of charge value determined from the voltage or current value actually detected is substituted into a voltage-SOC standard control curve to determine a presumed voltage value. Then, to what degree the actual voltage value differs from the presumed voltage value is determined. In this way, predetermined measures can be taken to eliminate the difference when the difference is big. Accordingly, the secondary battery can be controlled in high accuracy and occurrence of overcharge and over discharge can be suppressed.

DETAILED DESCRIPTION OT THE EMBODIMENTS

In the following, an embodiment of the present invention is described based on the figures. First, an example of a secondary battery, which is the charge control target, is explained and then the control method and control device according to an embodiment of the present invention are described.

<Example of Secondary Battery Configuration>

Figure 1:
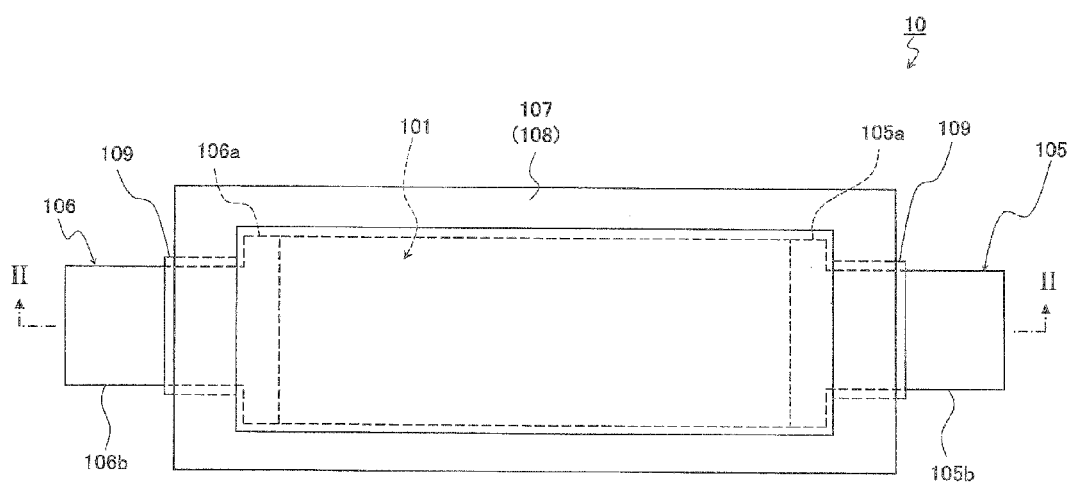
FIG. 1 is a plan view showing an example of a secondary battery, which is the charge control target of the control method and control device according to the present invention.
Figure 2:
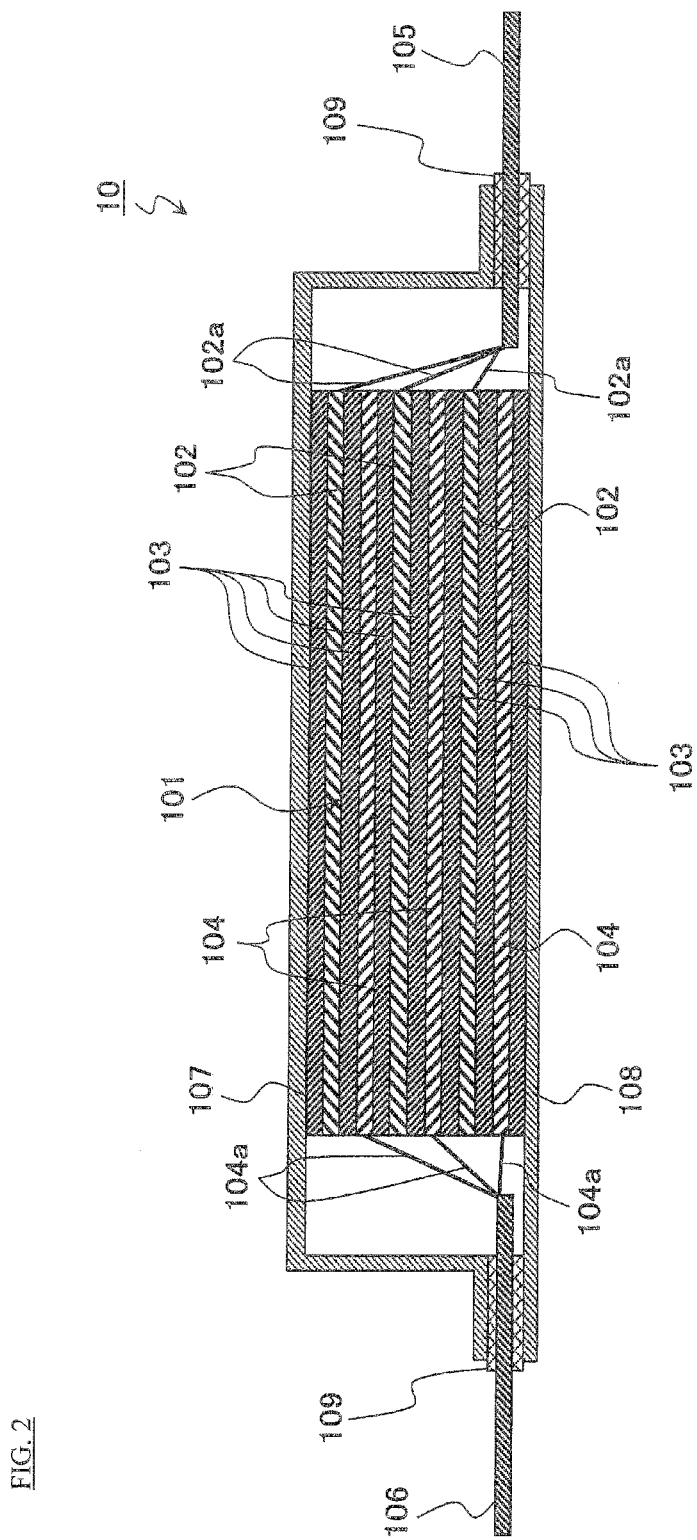
FIG. 2 is a sectional view taken along line II-II of FIG. 1.

FIG. 1 is a plan view showing an example of a secondary battery, which is the charge control target of the control method and control device in the present invention, and FIG. 2 is a sectional view taken along line II-II of FIG. 1. As an example of a secondary battery 10 as the charge control target, for example, a lithium-based secondary battery, etc., such as a lithium ion secondary battery can be exemplified. However, the secondary battery indicated in the following is only an example of the charge control target of the control method and control device of the present invention that secondary batteries with any other configuration are also included as the charge control target of the present invention.

As shown in FIGS. 1 and 2, the secondary battery 10 is formed from: an electrode stack 101 having three positive electrode plates 102, seven separators 103 and three negative electrode plates 104; a positive electrode tab 105 and a negative electrode tab 106 which are each connected to the electrode stack 101; an upper jacket member 107 and a lower jacket member 108 which accommodate therebetween these electrode stack 101, positive electrode tab 105 and negative electrode tab 106 and seals them; and electrolyte (not shown). Here, the number of each of the positive electrode plate 102, the separator 103 and the negative electrode plate 104 is not especially limited. The electrode stack 101 could be formed by one positive electrode plate 102, three separators 103 and one negative electrode plate 104. Further, the number of each of the positive electrode plate 102, the separator 103 and the negative electrode plate 104 could be selected as necessary.

The positive electrode plate 102 forming the electrode stack 101 has a positive electrode side current collector 102a that extends up to the positive electrode tab 105 and positive electrode active material layers that are formed on both main surfaces of a part of the positive electrode side current collector 102a. As the positive electrode side current collector 102a forming the positive electrode plate 102, it is, for example, electrochemically stable metal leaf (or electrochemically stable metal foil) such as aluminum leaf (or foil), aluminum alloy leaf (or foil), copper titanium leaf (or foil) and stainless leaf (or foil), each of which has about 20 μm thickness.

The positive electrode active material layer forming the positive electrode plate 102 is formed by applying a mixture of positive electrode active material, a conductive agent such as carbon black and a binding agent such as aqueous dispersion of polyvinylidene fluoride or polytetrafluoroethylene to the main surfaces of a part of the positive electrode side current collector 102a and by drying and pressing them. In the secondary battery 10 of the present embodiment, the positive electrode active material layer is especially formed by positive electrode active material made of solid solution material. As such the solid solution material using as the positive electrode active material, it is not especially limited. It is, for example, a transition metal oxide containing solid solution lithium expressed by the following general chemical formula (1).

$$Li_{1.5}[Ni_aCo_bMn_c[Li]_d]O_3 \qquad (1)$$

(In Formula (1), Li denotes lithium, Ni denotes nickel, Co denotes cobalt, Mn denotes manganese and O denotes oxygen. Moreover, a, b, c and d satisfy relationships: $0<a<1.4$; $0\leq b<1.4$; $0<c<1.4$; $0.1<d\leq 0.4$; $a+b+c+d=1.5$; and $1.1\leq a+b+c<1.4$.

Then, the transition metal oxide containing solid solution lithium according to the present embodiment includes: a layered structure region; and a region ($Li_2MnO_3$ with a layered structure) changed to a spinel structure by being subjected to charge or charge/discharge in a predetermined electrical potential range. Moreover, such $Li_2MnO_3$ with the layered structure in the transition metal oxide containing solid solution lithium is changed to $LiMn_2O_4$ with a spinel structure. Then, when a ratio of the entire change from $Li_2MnO_3$ with the layered structure to $LiMn_2O_4$ with the spinel structure is defined to be 1, a spinel structure change ratio of the transition metal oxide containing solid solution lithium is 0.25 or more to less than 1.0.

The "spinel structure change ratio" prescribes a change ratio from $Li_2MnO_3$ with the layered structure in the transition metal oxide containing solid solution lithium to $LiMn_2O_4$ with the spinel structure in the case where the transition metal oxide containing solid solution lithium performs such charge or such charge/discharge in the predetermined electrical potential range. Then, the spinel structure change ratio in the case where $Li_2MnO_3$ with the layered structure in the transition metal oxide containing solid solution lithium is entirely changed to $LiMn_2O_4$ with the spinel structure is defined to be 1. Specifically, the spinel structure change ratio is defined by the following Math. 1.

$$\left(\begin{array}{c}\text{Spinel structure change}\\ \text{ratio }(K)\end{array}\right) = \qquad [\text{Math. 1}]$$

-continued $$\frac{(\text{Actual capacity of plateau region})}{\left(\begin{array}{c}\text{Theoretical capacity caused by}\\ Li_2MnO_3\text{ in transmition metal}\\ \text{oxide }(Vs)\end{array}\right) \times \left(\begin{array}{c}\text{Composition ratio of }Li_2MnO_3\\ \text{in transmition metal oxide }(x)\end{array}\right)}$$

Figure 3:
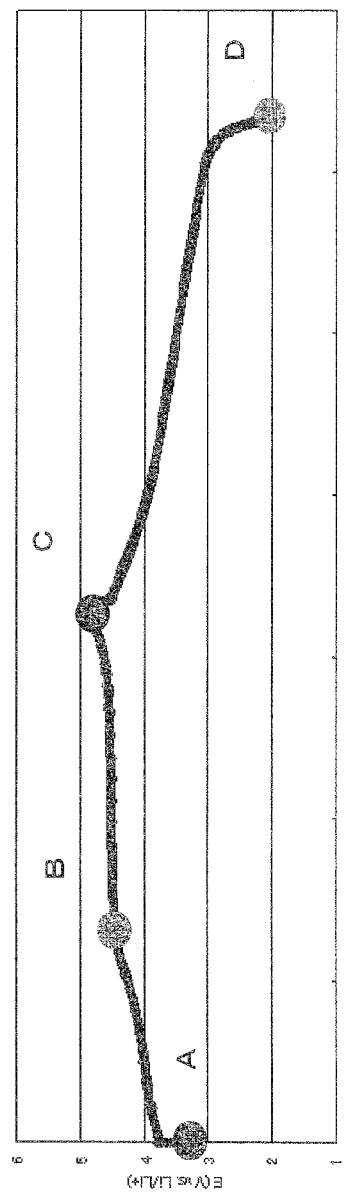
FIG. 3 is a graph to explain definition of the spinel structure change ratio.

A description is made of the definition of the "spinel structure change ratio" by taking the case shown in FIG. 3 as an example. FIG. 3 is a graph showing a relationship between an electrical potential and a capacity for a battery assembled by using a positive electrode in which the transition metal oxide containing containing solid solution lithium is used as the positive electrode active material. With regard to the battery, a state where the battery is charged to 4.5V from an initial state A before the charge is started is defined as a charge state B. Moreover, a state where the battery is charged to 4.8V from the charge state B through a plateau region is defined as an overcharge state C, and further, a state where the battery is discharged to 2.0V is defined as a discharge state D. Then, for the "actual capacity of plateau region" in Math. 1 described above, an actual capacity of the transition metal oxide containing solid solution lithium in the plateau region of FIG. 3 just needs to be measured. Note that, specifically, the plateau region is a region from 4.5V to 4.8V, and is a region caused by the fact that the crystal structure is changed. Therefore, an actual capacity $V_{BC}$ of the battery in a region BC from the charge state B to the overcharge state C corresponds to the actual capacity of the plateau region.

In actual, in the transition metal oxide containing solid solution lithium of Chemical formula (1), an actual capacity $V_{AB}$ of a region AB from the initial state A to the charge state B where the battery is charged to 4.5V relates to a product of a composition ratio of $LiMO_2$ (y) with the layer like structure and a theoretical capacity of $LiMO_2$ ($V_L$). Moreover, the actual capacity $V_{BC}$ in the region BC from the charge state B where the battery is charged to 4.5V to the overcharge state C where the battery is charged to 4.8V relates to a product of the composition ratio of $Li_2MnO_3$ (x) as the spinel structure region and a theoretical capacity of $Li_2MnO_3$ ($V_S$). Therefore, when an actual capacity ($V_T$) measured from the initial state A to such a predetermined plateau region is defined as ($V_T=V_{AB}+V_{BC}$), the spinel structure change ratio can be calculated by using the following Math. 2 since relationships: $V_{AB}=y\times(V_L)$; and $V_{BC}=x\times(V_S)\times K$ are established. Note that M in the above-mentioned Chemical formula $LiMO_2$ denotes at least one selected from the group consisting of nickel (Ni), cobalt (Co) and manganese (Mn).

$$\left(\begin{array}{c}\text{Spinel structure}\\ \text{change ratio }(K)\end{array}\right) = \qquad [\text{Math. 2}]$$

$$\frac{\left(\begin{array}{c}\text{Actual capacity}\\\text{measured to plateau}\\\text{region }(V_T)\end{array}\right) - \left(\begin{array}{c}\text{Theoretical}\\\text{capacity caused by}\\\text{LiMO}_2\text{ in}\\\text{transmition metal}\\\text{oxide }(V_L)\end{array}\right) \times \left(\begin{array}{c}\text{Composition ratio}\\\text{of LiMO}_2\text{ in}\\\text{transmition metal}\\\text{oxide }(y)\end{array}\right)}{\left(\begin{array}{c}\text{Theoretical capacity caused by}\\\text{Li}_2\text{MnO}_3\text{ in transmition metal}\\\text{oxide }(V_S)\end{array}\right) \times \left(\begin{array}{c}\text{Composition ratio of Li}_2\text{MnO}_3\\\text{in transmition metal oxide }(x)\end{array}\right)}$$

The "composition ratio of $Li_2MnO_3$ in transition metal oxide" can be calculated from Chemical formula of the transition metal oxide containing solid solution lithium. It can be determined whether or not the layered structure region, which is not changed to the spinel structure region, and the spinel structure region are present in the transition metal oxide containing solid solution lithium based on presence of peaks unique to the layered structure region and the spinel structure, which can be observed by X-ray diffraction analysis (XRD). Moreover, the ratio of the layered structure region and the spinel structure region can be determined based on the capacity measurement and calculation as mentioned above.

In the transition metal oxide containing solid solution lithium, the spinel structure change ratio does not become 1.0. Moreover, in a case where the spinel structure change ratio is less than 0.25, then what is obtained is only a transition metal oxide containing solid solution lithium, which is capable of realizing a discharge capacity and a capacity retention ratio, of which degrees are no larger than the conventional ones.

In the transition metal oxide containing solid solution lithium according to the present embodiment, it is necessary that a, b, c and d satisfy relationships: $0<a<1.4$; $0\leq b<1.4$; $0<c<1.4$; $0.1<d\leq 0.4$; $a+b+c+d=1.5$; and $1.1\leq a+b+c<1.4$ in Chemical formula (1). In a case where such mathematical formulas are not satisfied, then there is a possibility that a crystal structure of the transition metal oxide containing solid solution lithium may not be stabilized.

In the transition metal oxide containing solid solution lithium according to the present embodiment, in Chemical formula (1), preferably, a, b, c, and d satisfy relationships: $0<a<1.35$; $0\leq b<1.35$; $0<c<1.35$; $0.15<d\leq 0.35$; $a+b+c+d=1.5$; and $1.15\leq a+b+c<1.35$. Moreover, in the case where the charge or the charge/discharge in the predetermined electrical potential range is performed, suitably, the spinel structure change ratio of the transition metal oxide containing solid solution lithium is 0.4 or more to less than 0.9. Moreover, in the transition metal oxide containing solid solution lithium according to the present embodiment, in Chemical formula (1), more preferably, a, b, c, and d satisfy relationships: $0<a<1.3$; $0\leq b<1.3$; $0<c<1.3$; $0.15<d\leq 0.35$; $a+b+c+d=1.5$; and $1.2\leq a+b+c<1.3$. Furthermore, in the case where the charge or the charge/discharge in the predetermined electrical potential range is performed, more suitably, the spinel structure change ratio of the transition metal oxide containing solid solution lithium is 0.6 or more to 0.8 or less.

In a case of being used as the positive electrode active material for the lithium ion secondary battery, the transition metal oxide containing solid solution lithium, which is as described above, is capable of realizing higher discharge capacity and capacity retention ratio, and accordingly, is more suitably used for the lithium ion secondary battery positive electrode and the lithium ion secondary battery. Therefore, the secondary battery using the transition metal oxide containing solid solution lithium is more suitably used as a vehicle drive power source or assist power source. In addition, the secondary battery using the transition metal oxide containing solid solution lithium is more suitably used as a household power source or a power source of a mobile device.

A description is made of a production method of the transition metal oxide containing solid solution lithium according to the present embodiment. First, as a precursor of the transition metal oxide containing solid solution lithium, a mixture is prepared by mixing raw materials with one another, which contain a lithium compound, a nickel compound, a cobalt compound and a manganese compound such as sulfates and nitrates. Subsequently, the obtained mixture is calcined at 800 to 1000° C. for 6 to 24 hours under an inert gas atmosphere. In such a way, the transition metal oxide containing solid solution lithium can be prepared.

Moreover, as another production method, first, as the precursor of the transition metal oxide containing solid solution lithium, a mixture is prepared by mixing raw materials with one another, which contain a lithium compound, a nickel compound, a cobalt compound and a manganese compound such as sulfates and nitrates. Subsequently, the obtained mixture is calcined at 800 to 1000° C. for 6 to 24 hours, whereby a calcined product is obtained. Thereafter, the calcined product thus obtained is subjected to heat treatment at 600 to 800° C. under an inert gas atmosphere. In such a way, the transition metal oxide containing solid solution lithium can be prepared.

The binder is not particularly limited, however, the following materials are exemplified. For example, there are exemplified thermoplastic polymers such as: polyethylene (PE), polypropylene (PP), polyethylene terephthalate (PET), polyether nitrile (PEN), polyacrylonitrile (PAN), polyimide (PI), polyamide (PA), cellulose, carboxymethyl cellulose (CMC), an ethylene-vinyl acetate copolymer, polyvinyl chloride (PVC), styrene-butadiene rubber (SBR), isoprene rubber, butadiene rubber, ethylene-propylene rubber, an ethylene-propylene-diene copolymer, a styrene-butadiene-styrene block copolymer and a hydrogen-added product thereof, and a styrene-isoprene-styrene block copolymer and a hydrogen-added product thereof.

Moreover, there are exemplified fluorine resins such as polyvinylidene fluoride (PVDF), polytetrafluoroethylene (PTFE), a tetrafluoroethylene-hexafluoropropylene copolymer (FEP), a tetrafluoroethylene-perfluoroalkyl vinyl ether copolymer (PFA), an ethylene-tetrafluoroethylene copolymer (ETFE), polychlorotrifluoroethylene (PCTFE), an ethylene-chlorotrifluoroethylene copolymer (ECTFE), and polyvinyl fluoride (PVF).

Furthermore, there are exemplified: vinylidene fluoride-based fluorine rubber such as vinylidene fluoride-hexafluoropropylene-based fluorine rubber (VDF-HFP-based fluorine rubber), vinylidene fluoride-hexafluoropropylene-tetrafluoroethylene-based fluorine rubber (VDF-HFP-TFE-based fluorine rubber), vinylidene fluoride-pentafluoropropylene-based fluorine rubber (VDF-PFP-based fluorine rubber), vinylidene fluoride-pentafluoropropylene-tetrafluoroethylene-based fluorine rubber (VDF-PFP-TFE-based fluorine rubber), vinylidene fluoride-perfluoromethyl vinyl ether-tetrafluoroethylenebased rubber (VDF-PFMVE-TFE-based fluorine rubber), and vinylidene fluoride-chlorotrifluoroethylene-based fluorine rubber (VDF-CTFE-based fluorine rubber); epoxy resin; and the like.

Among them, more preferably, the binder is polyvinylidene fluoride, polyimide, styrene-butadiene rubber, carboxymethyl cellulose, polypropylene, polytetrafluoroethylene, polyacrylonitrile, and polyamide. These suitable binders are excellent in heat resistance, further have extremely wide potential windows, are stable at both of the positive electrode potential and the negative electrode potential, and are usable for the positive electrode active material layer and the negative electrode active material layer.

However, the binder is not limited to these, and materials, which are known in public and have been heretofore used as the binder for the lithium ion secondary battery, can be used. These binders may be each used singly, or two or more thereof may be used in combination.

An amount of the binder contained in the positive electrode active material layer is not particularly limited as long as the binder can bind the positive electrode active material. However, the amount of binder is preferably 0.5 to 15 mass %, more preferably 1 to 10 mass % with respect to the positive electrode active material layer.

The conductive assistant is one to be blended in order to enhance the conductivity of the positive electrode active material layer. As the conductive assistant, for example, there can be exemplified carbon materials such as: carbon black including acetylene black; graphite; and vapor deposited carbon fiber. When the positive electrode active material layer contains the conductive assistant, an electron network in the inside of the positive electrode active material layer is formed effectively, and such containing of the conductive assistant can contribute to the enhancement of the output characteristics of the battery. However, the conductive assistant is not limited to these, and materials, which have been heretofore known in public and are used as the conductive assistants for the lithium ion secondary battery, can be used. These conductive assistants may be each used singly, or two or more thereof may be used in combination.

Moreover, a conductive binder, which has functions of the above-described conductive assistant and binder in combination, may be used in place of these conductive assistant and binder, or may be used in combination with one or both of these conductive assistant and binder. As the conductive binder, for example, commercially available TAB-2 (made by Hohsen Corporation) can be used.

Furthermore, it is suitable that a density of the positive electrode active material layer be 2.5 g/cm$^3$ or more to 3.0 g/cm$^3$ or less. In the case where the density of the positive electrode active material layer is 2.5 g/cm$^3$ or more, weight (filler content) thereof per unit volume is increased, whereby it is made possible to enhance the discharge capacity. Moreover, in the case where the density of the positive electrode active material layer is 3.0 g/cm$^3$ or less, reduction of a void amount of the positive electrode active material layer is prevented, whereby permeability of a non-aqueous electrolytic solution and diffusivity of lithium ions can be enhanced.

As shown in FIGS. 1 and 2, each of the positive electrode side current collectors 102a having above solid solution positive electrode active material layer and forming the three positive electrode plates 102 is connected to the positive electrode tab 105. As the positive electrode tab 105, for example, aluminum leaf (or foil), aluminum alloy leaf (or foil), copper leaf (or foil) and nickel leaf (or foil), each of which has about 0.2 mm thickness, could be used.

The negative electrode plate 104 forming the electrode stack 101 has a negative electrode side current collector 104a that extends up to the negative electrode tab 106 and negative electrode active material layers that are formed on both main surfaces of a part of the negative electrode side current collector 104a. The negative electrode side current collector 104a of the negative electrode plate 104 is, for example, electrochemically stable metal leaf (or electrochemically stable metal foil) such as nickel leaf (or foil), copper leaf (or foil), stainless leaf (or foil) and iron leaf (or foil), each of which has about 10 μm thickness.

The negative electrode active material layer forming the negative electrode plate 104 contains, as the negative electrode active material, a negative electrode material capable of occluding and discharging lithium, and may contain a binder and a conductive assistant according to needs. Note that, as the binder and the conductive assistant, those mentioned above can be used.

The negative electrode active material layer is formed by preparing a slurry by adding a binding agent such as polyvinylidene fluoride and a solvent such as N-2-methylpyrrolidone to negative electrode active material such as non-graphitizable carbon, graphitizable carbon and graphite, and by applying the slurry to the both main surfaces of a part of the negative electrode side current collector 104a, then by drying and pressing them.

In the secondary battery 10 of the present embodiment, the three negative electrode plates 104 are formed so that each of the negative electrode side current collectors 104a forming the negative electrode plates 104 is connected to the single negative electrode tab 106. That is, in the secondary battery 10 of the present embodiment, each negative electrode plate 104 is formed so as to connect to the single common negative electrode tab 106.

As the negative electrode material capable of occluding and discharging lithium, for example, there can be exemplified carbon materials such as graphite (natural graphite, artificial graphite and the like) as high crystalline carbon, low crystalline carbon (soft carbon, hard carbon), carbon black (Ketjen black, acetylene black, channel black, lamp black, oil furnace black, thermal black and the like), fullerene, carbon nanotube, carbon nanofiber, carbon nano-horn, and carbon fibril. Note that the carbon materials include one containing 10 mass % or less silicon nanoparticles.

Moreover, there can be exemplified: simplexes of elements which make alloys with lithium, the elements including silicon (Si), germanium (Ge), tin (Sn), lead (Pb), aluminum (Al), indium (In), zinc (Zn), hydrogen (H), calcium (Ca), strontium (Sr), barium (Ba), ruthenium (Ru), rhodium (Rh), iridium (Ir), palladium (Pd), platinum (Pt), silver (Ag), gold (Au), cadmium (Cd), mercury (Hg), gallium (Ga), thallium (Tl), carbon (C), nitrogen (N), antimony (Sb), bismuth (Bi), oxygen (O), sulfur (S), selenium (Se), tellurium (Te), chlorine (Cl) and the like; and oxides (silicon monoxide (SiO), $SiO_x$ (0<x<2), tin dioxide ($SnO_2$), $SnO_x$ (0<x<2), $SnSiO_3$ and the like), carbides (silicon carbide (SiC) and the like) and the like, which contain these elements.

Furthermore, metal materials such as lithium metal and lithium-transition metal composite oxides such as lithium-titanium composite oxides (lithium titanate: $Li_4Ti_5O_{12}$) can be exemplified.

However, the negative electrode active material is not limited to these, and materials, which have been heretofore known in public and are used as the negative electrode active material for the lithium ion secondary battery, can be used.

These negative electrode active materials may be each used singly, or two or more thereof may be used in combination.

Moreover, in the present embodiment, suitably, the carbon material is made of a black lead material, which is coated with an amorphous carbon layer, and does not have a scale shape. Moreover, suitably, a BET specific surface area of the carbon material is 0.8 m$^2$/g or more to 1.5 m$^2$/g or less, and a tap density thereof is 0.9 g/cm$^3$ or more to 1.2 g/cm$^3$ or less.

The carbon material made of the black lead material, which is coated with an amorphous carbon layer, and does not have a scale shape, is preferable since lithium ion diffusivity to a black lead layered structure is high.

Moreover, if the BET specific surface area of the carbon material as described above is 0.8 m$^2$/g or more to 1.5 m$^2$/g or less, then such a capacity retention ratio can be further enhanced. Furthermore, if the tap density of the carbon material as described above is 0.9 g/cm$^3$ or more to 1.2 g/cm$^3$ or less, then weight (filler content) thereof per unit volume can be enhanced, and the discharge capacity can be enhanced.

Furthermore, in the present embodiment, suitably, a BET specific surface area of the negative electrode active material layer, which contains at least the carbon material and the binder, is 2.0 m$^2$/g or more to 3.0 m$^2$/g or less. By the fact that the BET specific surface area of the negative electrode active material layer is 2.0 m$^2$/g or more to 3.0 m$^2$/g or less, the permeability of the non-aqueous electrolytic solution can be enhanced, the capacity retention ratio can be further enhanced, and generation of gas owing to decomposition of the non-aqueous electrolytic solution can be suppressed.

Moreover, in the present embodiment, suitably, a BET specific surface area of the negative electrode active material layer, which contains at least the carbon material and the binder, the BET specific surface area being obtained after the negative electrode active material layer is press-molded, is 2.01 m$^2$/g or more to 3.5 m$^2$/g or less. The BET specific surface area of the negative electrode active material layer thus already press-molded is set at 2.01 m$^2$/g or more to 3.5 m$^2$/g or less, whereby the permeability of the non-aqueous electrolytic solution can be enhanced, the capacity retention ratio can be further enhanced, and the generation of gas owing to the decomposition of the non-aqueous electrolytic solution can be suppressed.

Furthermore, in the present embodiment, suitably, an increment of the BET specific surface area before and after the negative electrode active material layer, which contains at least the carbon material and the binder, is press-molded, is 0.01 m$^2$/g or more to 0.5 m$^2$/g or less. In such a way, the BET specific surface area after the negative electrode active material layer is press-molded can be set at 2.01 m$^2$/g or more to 3.5 m$^2$/g or less, whereby the permeability of the non-aqueous electrolytic solution can be enhanced, the capacity retention ratio can be further enhanced, and the generation of gas owing to the decomposition of the non-aqueous electrolytic solution can be suppressed.

Moreover, a thickness of each of the active material layers (each active material layer on one of the surfaces of each current collector) is not particularly limited, either, and knowledge heretofore known in public about the battery can be referred to as appropriate. An example of the thickness is mentioned. In usual, the thickness of each active material layer approximately ranges from 1 to 500 μm, preferably 2 to 100 μm in consideration of the usage purpose of the battery (output is regarded important, energy is regarded important, and so on), and of ion conductivity.

Moreover, in the case where optimum particle diameters are different among the respective active materials in the event of developing the effects individually intrinsic to the active materials, the active materials just need to be mixed and used while setting the optimum particle diameters in the event of developing the effects individually intrinsic thereto. Accordingly, it is not necessary to uniform the particle diameters of all of the active materials. For example, in the case of using one with a particle form as the positive electrode active material made of the transition metal oxide containing solid solution lithium, a mean particle diameter thereof just needs to be substantially the same as a mean particle diameter of the positive electrode active material contained in the existing positive electrode active material layer, and is not particularly limited. The mean (average) particle diameter just needs to preferably range from 1 to 20 μm from the viewpoint of the output enhancement.

Note that the "particle diameter" stands for a maximum distance among distances, each of which is between arbitrary two points on outlines of the active material particles (observed surfaces) observed by using observing means such as a scanning electron microscope (SEM) and a transmission electron microscope (TEM). As a value of the "mean particle diameter", a value is employed, which is calculated as a mean value of particle diameters of particles observed in several to several ten visual fields by using the observing means such as the scanning electron microscope and the transmission electron microscope. Particle diameters and mean particle diameters of the other constituent components can also be defined in a similar way. However, the mean particle diameters are never limited to the range as described above, and may go out of this range as long as the functions and effects of this embodiment can be developed effectively.

The separator 103 of the electrode stack 101 is an element that prevents a short circuit between the positive electrode plate 102 and the negative electrode plate 104. The separator 103 might have a function of holding the electrolyte. This separator 103 is a macroporous film formed from, for example, polyolefin such as polyethylene (PE) and polypropylene (PP) each having about 25 μm thickness, which also has a function of interrupting current by the fact that when overcurrent (excess current) flows, pores on the layer are closed by heat of the overcurrent. As shown in FIG. 2, by alternately arranging the positive electrode plate 102 and the negative electrode plate 104 in layers through the separator 103 and also by arranging the separator 103 on an uppermost layer and a lowermost layer of this layered arrangement, the electrode stack 101 is formed.

As the electrolyte which the secondary battery 10 contains, there can be exemplified: one in which a layer structure is formed by using an electrolytic solution held in a separator 103, and by using a polymer gel electrolyte and a solid polymer electrolyte; and further, one in which a stacked structure is formed by using a polymer gel electrolyte and a solid polymer electrolyte.

Preferably, the electrolytic solution is one, which is usually used in the lithium ion secondary battery. Specifically, the electrolytic solution has a form in which a supporting electrolyte (lithium salt) is dissolved into an organic solvent.

As the lithium salt, for example, there can be exemplified at least one lithium salt selected from: inorganic acid anion salts; such as lithium hexafluorophosphate (LiPF$_6$), lithium tetrafluoroborate (LiBF$_4$), lithium perchlorate (LiClO$_4$), lithium hexafluoroarsenate (LiAsF$_6$), lithium hexafluorotantalate (LiTaF$_6$), lithium tetrachloroaluminate (LiAlCl$_4$) and lithium decachlorodecaborate (Li$_2$B$_{10}$Cl$_{10}$), and the like, and organic acid anion salts; such as lithium trifluoromethane sulfonate (LiCF$_3$SO$_3$), lithium bis(trifluoromethanesulfonyl)imide (Li(CF$_3$SO$_2$)$_2$N) and lithium bis(pentafluoroethanesulfonyl)imide (Li(C$_2$F$_5$SO$_2$)$_2$N), and the like.

Moreover, as the organic solvent, for example, there can be used at least one or two or more selected from: cyclic carbonates such as propylene carbonate (PC) and ethylene carbonate (EC); chain carbonates such as dimethyl carbonate (DMC), methyl ethyl carbonate (EMC) and diethyl carbonate (DEC); ethers such as tetrahydrofuran, 2-methyltetrahydrofuran, 1,4-dioxane, 1,2-dimethoxyethane and 1,2-dibutoxyethane; lactones such as γ-butyrolactone; nitriles such as acetonitrile; esters such as methyl propionate; amides such as dimethylformamide; methyl acetate; and methyl formate.

As the polymer gel electrolyte, there can be exemplified one which includes a polymer constituting the polymer gel electrolyte and an electrolytic solution in a conventionally known ratio. It is preferable that the ratio is a few weight % to 98 weight % from an ion conductivity point of view. The polymer gel electrolyte is one in which the above-described electrolytic solution usually used in the lithium ion secondary battery is contained in the solid polymer electrolyte having the ion conductivity. However, the polymer gel electrolyte is not limited to this, and also includes one in which a similar electrolytic solution is held in a polymer skeleton that does not have the lithium ion conductivity. As a polymer, which is used for the polymer gel electrolyte and does not have the lithium ion conductivity, for example, polyvinylidene fluoride (PVdF), polyvinyl chloride (PVC), polyacrylonitrile (PAN), polymethyl methacrylate (PMMA) and the like are usable. However, the polymer is not limited to these. Note that polyacrylonitrile (PAN), polymethyl methacrylate (PMMA) and the like belong, if anything, to a category of materials in which the ion conductivity is hardly present, and accordingly, can also be said to be polymers having the above-described ion conductivity. However, here, polyacrylonitrile and polymethyl methacrylate are illustrated as such polymers which do not have the lithium ion conductivity.

As the solid polymer electrolyte, for example, those can be exemplified, which have a configuration formed by dissolving the above-described lithium salts into polyethylene oxide (PEO), polypropylene oxide (PPO) and the like, and do not contain the organic solvent. Hence, in the case where the electrolyte layer is composed of the solid polymer electrolyte, there is no concern about the liquid leakage from the battery, and reliability of the battery can be enhanced.

Preferably, a thickness of the electrolyte layer is thin from a viewpoint of reducing internal resistance. The thickness of the electrolyte layer is usually 1 to 100 μm, preferably 5 to 50 μm. Note that a matrix polymer of the polymer gel electrolyte or the solid polymer electrolyte can develop excellent mechanical strength by forming a crosslinked structure. In order to form the crosslinked structure, a polymerizable polymer (for example a polyethylene oxide (PEO) and a polypropylene oxide (PPO)) for forming the polymer electrolyte just needs to be subjected to polymerization treatment such as thermal polymerization, ultraviolet polymerization, radiation polymerization and electron beam polymerization by using an appropriate polymerization initiator.

The electrode stack 101 formed in this manner is accommodated between and sealed with the upper jacket member 107 and the lower jacket member 108. The upper jacket member 107 and the lower jacket member 108 to seal the electrode stack 101 are formed by material having flexibility, e.g. a resin film such as polyethylene and polypropylene or a resin-metal thin film laminate material obtained by bonding (or laminating) resin such as the polyethylene and the polypropylene onto both surfaces of metal foil such as aluminum. By thermal-bonding (heat-bonding) these upper jacket member 107 and lower jacket member 108, the electrode stack 101 is sealed with the positive electrode tab 105 and the negative electrode tab 106 coming out to the outside.

The positive electrode tab 105 and the negative electrode tab 106 are each provided with a seal film 109 to secure absolute contact with the upper jacket member 107 and the lower jacket member 108 at portions where each of the positive electrode tab 105 and the negative electrode tab 106 contacts the upper jacket member 107 and the lower jacket member 108. As the seal film 109, it is not especially limited. It can be formed from, for example, synthetic resin material having excellent resistance of electrolyte and good thermal adhesion performance such as polyethylene, modified polyethylene, polypropylene, modified polypropylene and ionomer.

<Control Method and Control Device>

Figure 6A:
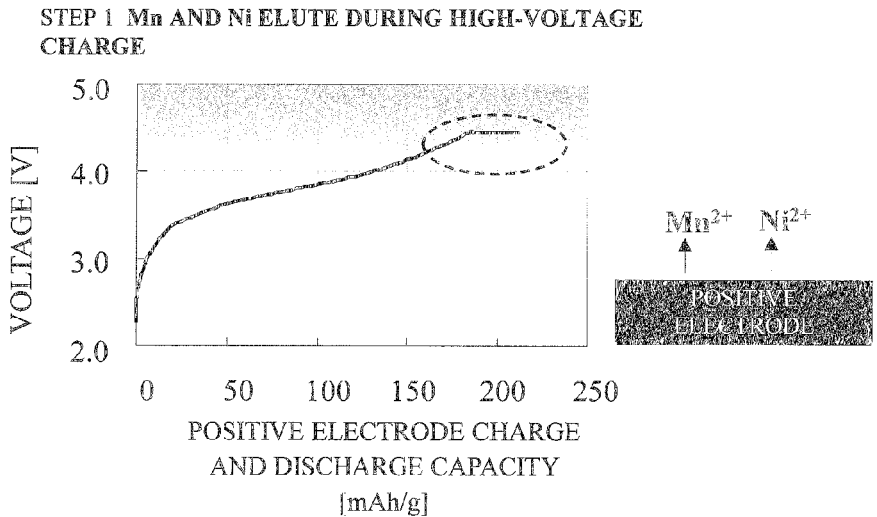
FIG. 6A is a diagram (part 1) to explain a problem of a secondary battery that uses a solid solution positive electrode.
Figure 6B:
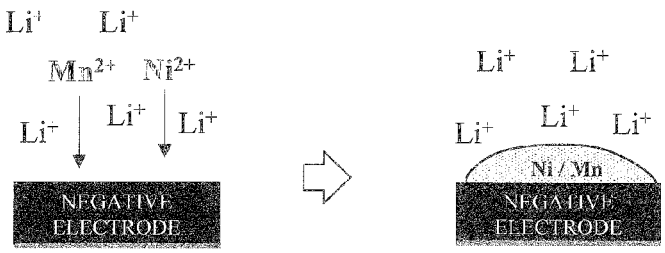
FIG. 6B is a diagram (part 2) to explain a problem of a secondary battery that uses a solid solution positive electrode.
Figure 6C:
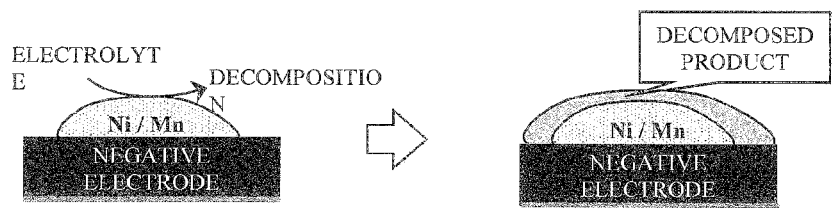
FIG. 6C is a diagram (part 3) to explain a problem of a secondary battery that uses a solid solution positive electrode.
Figure 6D:
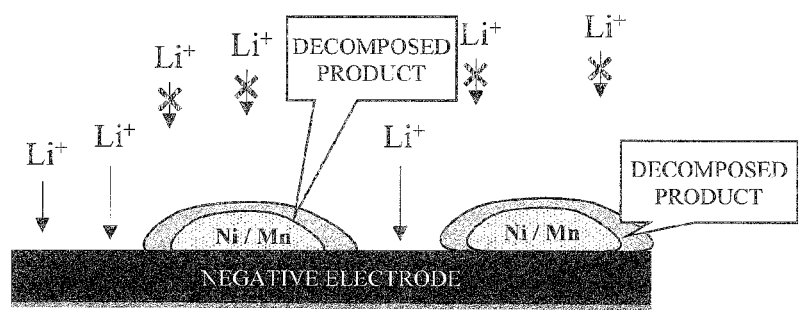
FIG. 6D is a diagram (part 4) to explain a problem of a secondary battery that uses a solid solution positive electrode.
Figure 7:
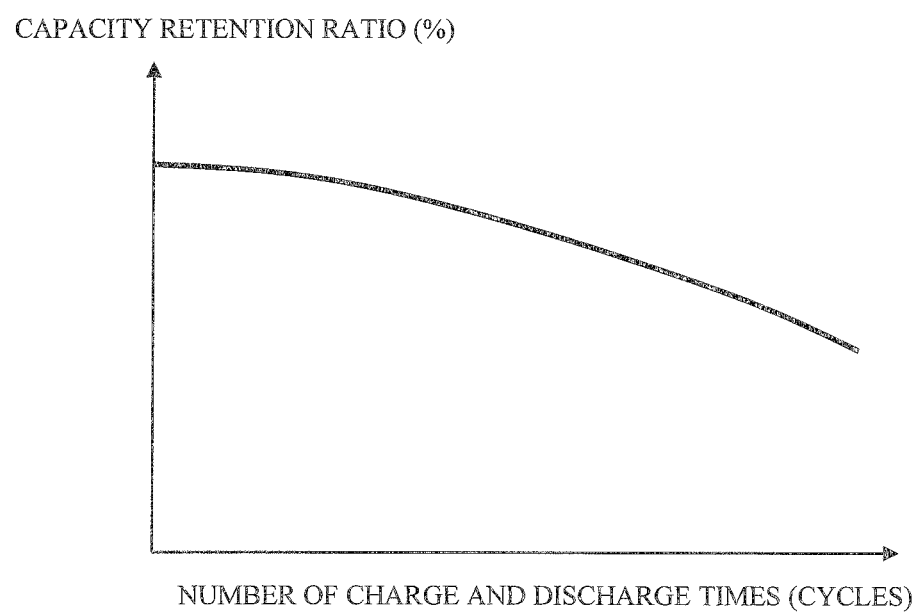
FIG. 7 is a graph showing a relationship of capacity retention ratio to the number of charge and discharge times of a secondary battery that uses a solid solution positive electrode.

Next, although a secondary battery that uses solid solution such as above-mentioned Li$_2$MnO$_3$ for a positive electrode, has a large discharge capacity, its cycle characteristics is bad. Thus, there is a technical problem in that the secondary battery may deteriorate easily when charge and discharge is repeated at high electrical potential. In other words, as shown in FIG. 7, in a secondary battery that uses solid-solution-based positive electrode, it is known that its capacity retention ratio drops when charge and discharge is repeated. The cause of such deterioration in cycle characteristics is considered to be as follows. That is, in a secondary battery that uses a solid-solution-based positive electrode, when constant-voltage charging is performed at high voltage for a long time as shown in FIG. 6A, transition metal ions such as Mn ions and Li ions elute from the positive electrode. The deposition electrical potentials of these Mn ions and Ni ions are higher than that of Li ions, therefore Mn ions and Ni ions eluted from the positive electrode are electrodeposited onto the negative electrode as shown in FIG. 6B. Then, as shown in FIG. 6C, electrolyte is decomposed by Mn and Ni electrodeposited onto the negative electrode, and its decomposed product is deposited onto the negative electrode. As a result, as shown in FIG. 6D, the deposit ends up in disturbing Li ion movement and this causes the battery to deteriorate (a rise in internal resistance). In other words, such increase in internal resistance causes the residual capacity that remain undischarged to remain in the battery. When this state is left unchanged, the positive electrode potential during charging shifts and the positive electrode potential becomes higher. This enhances deterioration of the battery.

Figure 4A:
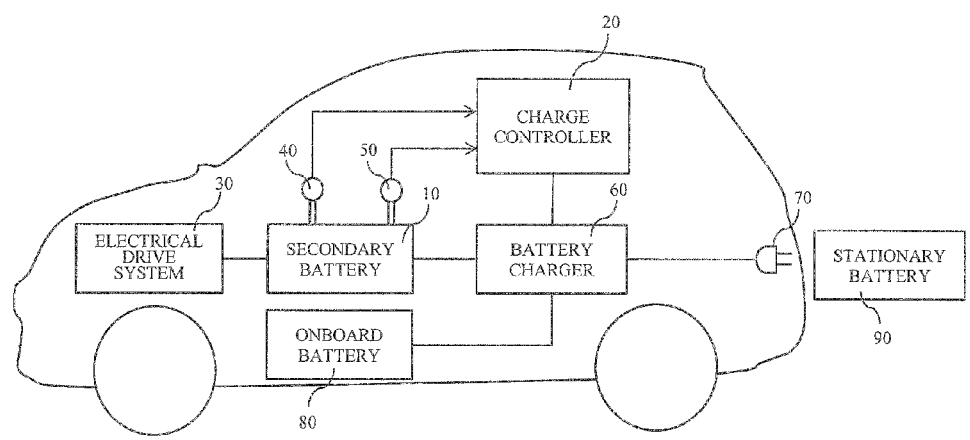
FIG. 4A is a block diagram of an electric vehicle for which a charge control device according to an embodiment of the present invention is applied.

For this reason, in the control method and control device according to the present embodiment, when the value of the residual amount becomes a value that can no longer be ignored after repeated charge and discharge, and in order to suppress generation of a difference thereby caused in the state of charge value, an actual open circuit voltage value of the secondary battery is detected, an actual state of charge value on the basis of the actual open circuit voltage value or an actual current value of the secondary battery is detected, a presumed voltage value is calculated from the actual state of charge value and a voltage-SOC standard control curve acquired in advance, and the sameness between the actual open circuit voltage value and the presumed voltage value is determined. Then, if the sameness between the actual open circuit voltage value and the presumed voltage value is high, the actual open circuit voltage value is used to control charge and discharge of the secondary battery, and if the sameness is low, a discharge process is performed to make the difference smaller. FIG. 4A is a block diagram of an electric vehicle for which the control device according to an embodiment of the present invention is applied, FIG. 4B is a block diagram showing details of the charge controller in FIG. 4A, FIG. 4C is a graph showing an example of a voltage-SOC standard control curve stored in the memory part in FIG. 4B, FIG. 5 is a flowchart showing the control method according to an embodiment of the present invention.

An electric vehicle according to the present embodiment includes, as shown in FIG. 4A, the above-mentioned secondary battery 10, a charge controller 20, an electrical drive system 30, a current sensor 40, a voltage sensor 50, a battery charger 60, an electric power input and output terminal 70, an onboard battery 80, and a stationary battery 90. The electrical drive system 30 according to the present embodiment is formed from a motor generator and invertor that output travel driving force to driving wheels upon receipt of electrode supply from the secondary battery 10, and supply power to be charged to the secondary battery 10 during regeneration. The battery charger 60 controls charge and discharge of the secondary battery 10 upon receipt of a control command from the charge control device 20, and also supplies discharged electric power of the secondary battery 10 to the onboard battery 80 or stationary battery 90. Further, the electric power input and output terminal 70 supplies electric power to the secondary battery 10 by having connected to a commercial power supply, or supplies discharged electric power from the secondary battery 10 to the stationary battery 90 by having connected to the stationary battery 90.

The charge control device 20 according to the present embodiment is a control device for controlling charge and discharge of the secondary battery 10 through the battery charger 60. The charge control device 20 controls charge and discharge of the secondary battery 10 and calculates a state of charge value of the secondary battery 10 on the basis of the charge and discharge current value that flows to and from the secondary battery 10 detected by the current sensor 40, and the open circuit voltage value of the secondary battery 10 detected by the voltage sensor 50. The current sensor 40 measures charge and discharge current value that flows to and from the secondary battery 10 and outputs it to the charge controller 20. Then, the voltage sensor 50 measures open circuit voltage value (the inter-terminal voltage value of the secondary battery 10 in a non-load state) of the secondary battery 10 and outputs it to the charge controller 20. Further, measurement of the open circuit voltage value of the secondary battery 10 by the voltage sensor 50 can be performed in a power off state such as while the vehicle is stopped, that is, when the power supply from the secondary battery 10 is shut off. Or, multiple samples from both open circuit voltage values of the secondary battery 10 detected by the voltage sensor 50 and current values detected by the current sensor 40 can be collected to determine an open circuit voltage of when the current value is zero from a regression line of I-V characteristics, and use it as the open circuit voltage value instead (see JP 2002-243813 A).

Figure 4B:
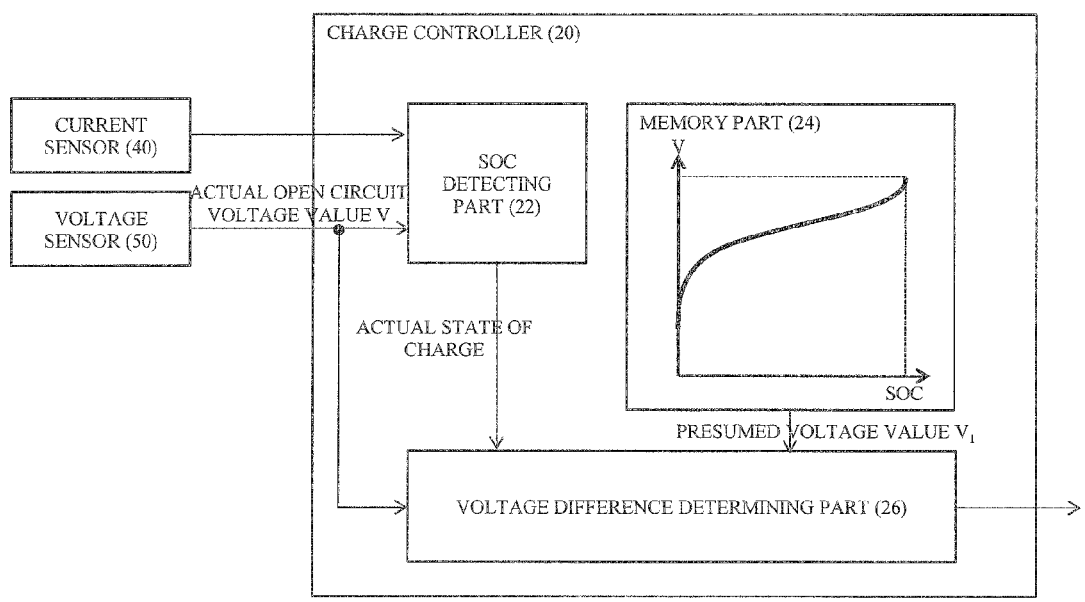
FIG. 4B is a block diagram showing details of the charge controller in FIG. 4A.
Figure 4C:
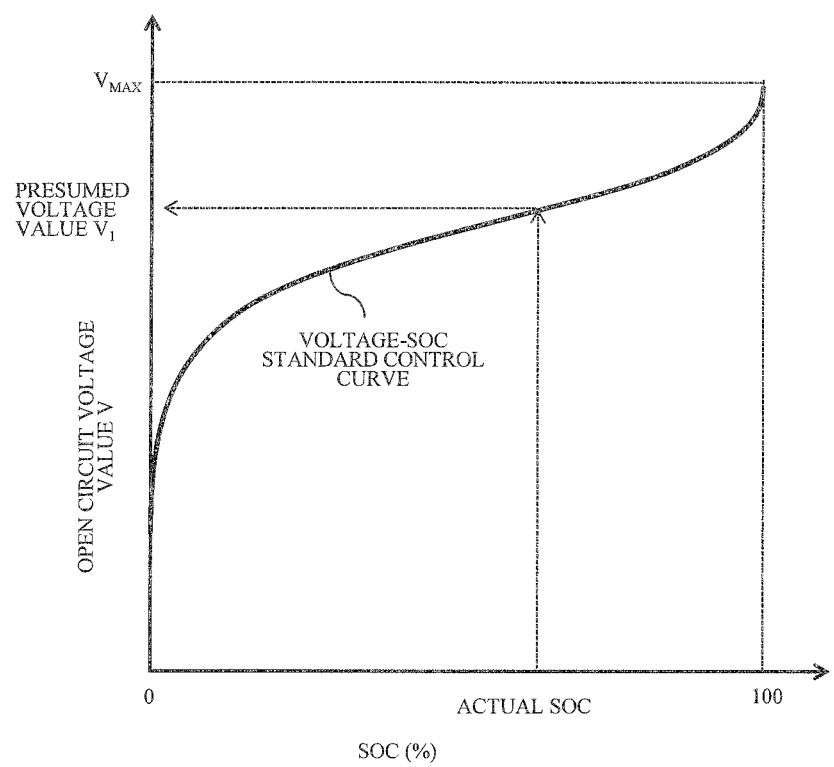
FIG. 4C is a graph showing an example of a voltage-SOC standard control curve stored in the memory part in FIG. 4B.
Figure 5:
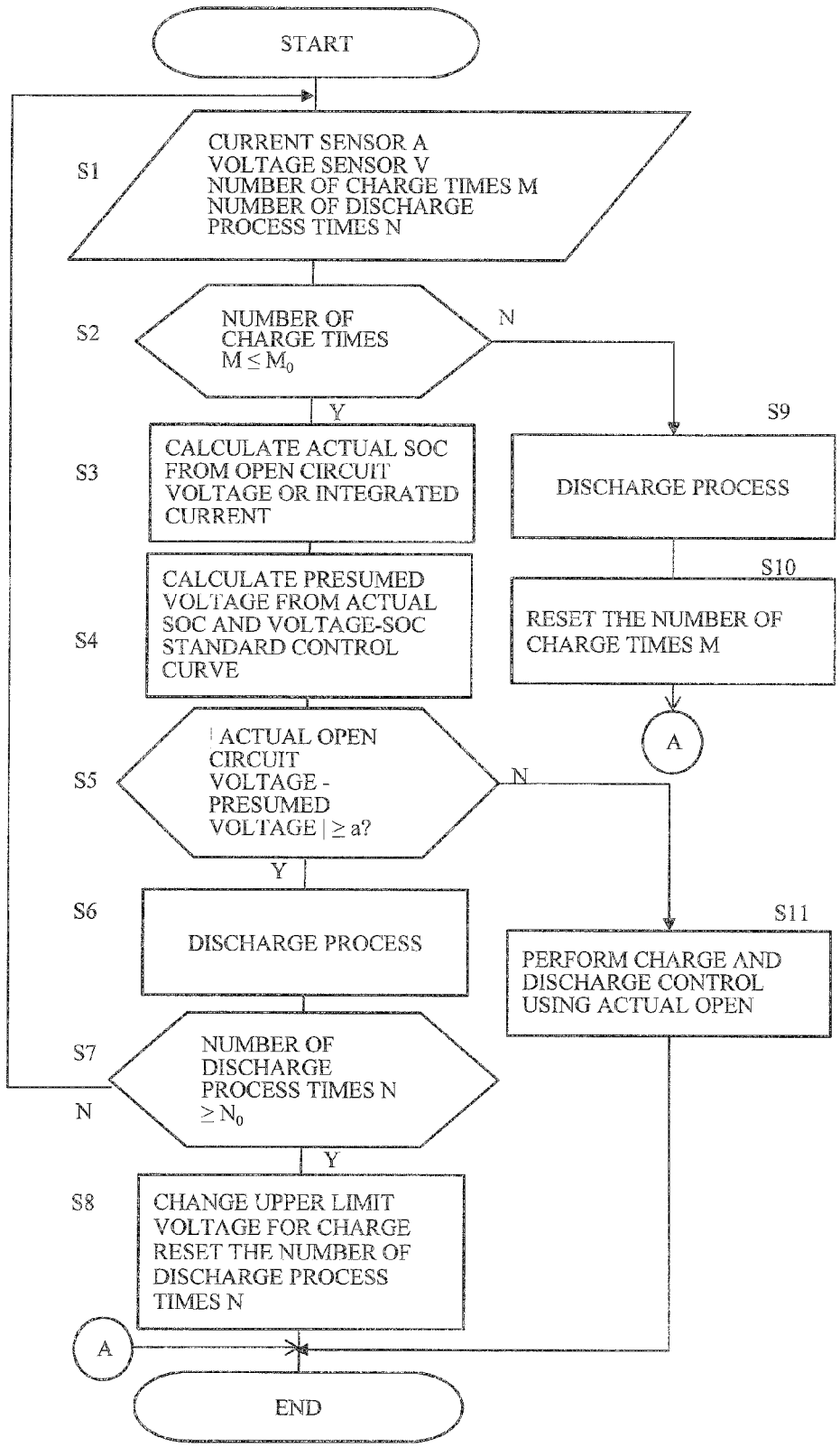
FIG. 5 is a flowchart showing the charge control method according to an embodiment of the present invention.

The charge controller 20 according to the present embodiment is configured from CPU or MPU, ROM, and RAM, and includes, as shown in FIG. 4B, an SOC detecting part 22, a memory part 24, and a voltage difference determining part 26. The SOC detecting part 22 calculates the present state of charge value of the secondary battery 10 by integrating the current values during charge and discharge detected by the current sensor 40, or the present state of charge value of the secondary battery 10 from the open circuit voltage value detected by the voltage sensor 50 instead.

The memory part 24 is a memory for storing a voltage-SOC standard control curve showing relationship between open circuit voltage value and state of charge value of the secondary battery 10. An example of a voltage-SOC standard control curve stored in the memory part 24 is shown in FIG. 4C. The voltage difference determining part 26 extracts a presumed voltage value $V_1$ by entering an actual state of charge value calculated by the SOC detecting part 22 and substituting the actual state of charge value into the voltage-SOC standard control curve stored in the memory part 24. Then, the presumed voltage value $V_1$ and the actual open circuit voltage value V detected by the voltage sensor 50 are compared to determine their sameness.

The sameness determined in the voltage difference determining part 26 is determined on the basis of a difference $\Delta V$ between a presumed voltage value $V_1$ and an actual open circuit voltage value V. If the difference $\Delta V$ falls within the predetermined range, the voltage difference determining part 26 determines that there is no difference between the actual open circuit voltage value V and a real open circuit voltage value, whereas, if the difference $\Delta V$ is out of the predetermined range, the voltage difference determining part 26 determines that there is a difference in the actual open circuit voltage value V detected by the voltage sensor 50. Then, when the actual open circuit voltage value V is determined to have no difference, the actual open circuit voltage value V detected by the voltage sensor 50 is used in a charge and discharge control of the secondary battery. But when the actual open circuit value V is determined to have a difference, a discharge process is performed to make the difference $\Delta V$ approximated to zero. Details of this discharge process is described later.

Next, with reference to FIG. 5, a charge controller 20 in FIGS. 4A and 4B and a control method of the secondary battery according to an embodiment of the present invention are described. First, in step S1, the charge controller 20 starts detection of a current value A that flows to the secondary battery 10 with the current sensor 40, and detection of a voltage value V that is applied to both terminals of the secondary battery 10 with the voltage sensor 50. Also, the present number of charge times M and the number of discharge process times N in step S6 are counted. Second, in step S2, determination is made on whether the present number of charge times M is equal to or less than the reference number of charge times $M_0$ set in advance. If the present number of charge times M is equal to or less than the reference number of charge times $M_0$, then the process proceeds to step S3. However, if the present number of charge times M is more than the reference number of charge times $M_0$, the process proceeds to step S9. In step S9, a discharge process of the secondary battery 10 is performed at a discharge rate set in advance. Then, the present number of charge times M is reset to M=0 times in step S10 and a sequence of the present embodiment ends. In step S9, regardless of the presence of a difference $\Delta V$ in an actual open circuit voltage value V described in the following, the discharge process is once performed when the charge process is performed for more than the predetermined number of charge times $M_0$ in order to prevent generation of a difference $\Delta V$ in the actual open circuit voltage value V beforehand.

In step S3, an actual state of charge value at the present for the secondary battery 10 is calculated from the current and/or voltage value detected in step S1. The actual state of charge value can be calculated by integrating the current values during charge and discharge detected by the current sensor 40 as mentioned above, or from the open circuit voltage value detected by the voltage sensor 50. In step S4, a presumed voltage value $V_1$ is determined by using the actual state of charge value calculated in step S3 and the voltage-SOC standard control curve as shown in FIG. 4C, stored in the memory part 24. As shown in FIG. 4C, an open circuit voltage value that corresponds to the actual state of charge value in the voltage-SOC standard control curve is defined as an actual open circuit voltage value $V_1$. In step S5, an absolute value $|V-V_1|$ of the difference between the presumed voltage value $V_1$ determined in step S4 and the actual open circuit voltage value V detected in step S1 is calculated and whether the absolute value is equal to or more than the predetermined value a set in advance is determined. In this way, cases where the actual open circuit voltage value is higher than the presumed voltage value and lower than the presumed voltage value can be both corrected. In step S5, if the absolute value of the difference $\Delta V$ between the actual open circuit voltage value V and presumed voltage value $V_1$ is less than the predetermined value a, then it is judged to be there is no difference that becomes a problem generated in the actual open circuit value V and the process proceeds to step S11. In step S11, a charge and discharge process for the secondary battery 10 is performed using the actual open circuit voltage value detected in step S1.

In contrast, in step S5, if the absolute value of the difference $\Delta V$ between the actual open circuit voltage value V and presumed voltage value $V_1$ is equal to or more than the predetermined value a, then the actual open circuit voltage value V is determined to have a difference that becomes a problem. Then, the process proceeds to step S6 and performs a discharge process to eliminate the difference $\Delta V$. Further, the discharge process is performed under a condition that does not affect drive of the secondary battery 10, such as before the next charge. However, in the flowchart shown in FIG. 5, the discharge process is indicated as the next step in the sequence for convenience of explanation. Preferably, the discharge process according to the present embodiment is performed at a discharge rate of 1 coulomb or below. Here, the discharge rate of 1 coulomb is defined as a current value a [A] that completes discharge of the secondary battery having a nominal capacity of a [Ah] in 1 hour at a constant discharge current. For example, in a case of a secondary battery 10 having a nominal capacity of 2.2 Ah, then 1 coulomb=2.2 A. By setting the discharge rate at 1 coulomb or below, the secondary battery 10 can be discharged completely regardless of the intrinsic resistance of its constituent material.

In the next step 7, determination is made on whether the number of discharge process times N reached or exceeded the reference number of discharge process times $N_0$ set in advance. If the present number of discharge process times N does not reach the reference number of discharge process times $N_0$ set in advance, then the process returns to step S1. Then, whether the difference $\Delta V$ of the actual open circuit voltage value V is eliminated or not by the discharge process in step S6 is determined in the following steps S3 to S5. If an absolute value of the difference $\Delta V$ in the actual open circuit voltage value V is still the predetermined value a or over, then the second discharge process is performed in the following step S6. Moreover, if the difference $\Delta V$ in the actual circuit voltage value V is not eliminated, these steps are repeated until the number of discharge process times N reaches the reference number of discharge process times $N_0$.

For the second and subsequent discharge process, preferably, the discharge rate is reduced stepwise from the first discharge rate. For example, when discharge rate of the first discharge process is 1 coulomb, set the discharge rate of the second discharge process to 0.1 coulomb and discharge rate of 0.05 coulomb for the third discharge process. As described above, by reducing the discharge rate in every discharge process when the discharge process is performed multiple times, even when complete discharge is not possible in the first discharge process due to greater value in discharge current than internal resistance of the secondary battery 10 when compared, complete discharge is possible in subsequent discharge processes.

After performing the discharge process for multiple times (less than $N_0$) as above, and as a result, if an absolute value of the difference $\Delta V$ between the actual open circuit voltage value V and the presumed voltage value $V_1$ became less than the predetermined value a in step S5, the difference in the actual open circuit voltage value V is judged to be eliminated and the process proceeds to step S11. In step S11, charge and the discharge process of the secondary battery 10 is performed using the actual open circuit voltage value determined in step S1 of that sequence.

In contrast, in step S5, if an absolute value of the difference $\Delta V$ between the actual open circuit voltage value V and presumed voltage value $V_1$ is still equal to or greater than the predetermined value a even after discharge process is performed for $N_0$ times, the difference in the actual open circuit voltage value V is judged it cannot be eliminated and the process proceeds to step S8. In step S8, the value already set for the upper limit voltage value for charge is changed to a lower value. In this way, appropriate upper limit voltage value that corresponds to the degradation level of the secondary battery 10 is set, thus overcharging can be prevented.

Moreover, the electric power discharged from the secondary battery 10 when the discharge process in step S6 is performed, preferably, is supplied to the onboard battery 80 or stationary battery 90 by controlling the battery charger 60 by the charge controller 20. In this way, remaining electric power in the secondary battery 10 can be used effectively without waste.

The following describes the present invention more in detail using detailed examples and comparative examples.

Example 1

Preparation of Negative Electrode

Graphite powder, acetylene black as a conductive assistant, and polyvinylidene fluoride (PVDF) as a binder were blended together so as to achieve their mass ratio of 90:5:5, and then N-methylpyrrolidone was added as a solvent to prepare a negative electrode slurry. Then, for each current collector, for which copper leaf (or foil) was used, negative electrode slurry obtained above was applied and then dried under a vacuum for 24 hours the desired negative electrode was obtained.

Preparation of Positive Electrode

As a positive electrode active material, $Li_{1.85}Ni_{0.18}Co_{0.10}Mn_{0.87}O_3$ (a=0.18, b=0.10, c=0.87, d=0.35 in Formula (1) above), acetylene black as a conductive assistant, polyvinylidene fluoride (PVDF) as a binder were blended together so as to achieve a mass ratio of 90:5:5, and then N-methylpyrrolidone was added as a solvent to prepare a positive electrode slurry. Then, for each current collector, for which aluminum leaf (or foil) was used, positive electrode slurry obtained above was applied and then dried under a vacuum for 24 hours and the desired positive electrode was obtained.

Preparation of Battery

The negative electrode and positive electrode prepared above were arranged opposing to each other and polyolefin separator was placed between them. This electrode stack of negative electrode, separator, and positive electrode was placed in an aluminum laminate cell. Then, 1 mole of lithium hexafluorophosphate ($LiPF_6$) as a lithium salt was blended to an organic solvent made from ethylene carbonate (EC) and diethyl carbonate (DEC) at the ratio of 1:2. The mixture, as an electrolyte, was injected into the cell and sealed and then the lithium ion secondary battery was obtained.

Capacity Retention Rate Characteristic Evaluation Test

A discharge capacity retention rate for the lithium ion secondary battery prepared as above was verified by performing a charge and discharge cycle test. In detail, under an atmosphere of 30° C. and with the constant current and constant voltage charge method, the battery was charged at the current density equivalent to 1 coulomb with the upper limit voltage of 4.45V. After having a minute break, the battery was discharged up to 2V at the current density equivalent to 1 coulomb with the constant current discharge method. This charge and discharge cycle was repeated for 100 times. Also, a control to discharge the battery up to 2V at the current density equivalent to 0.1 coulomb (step S6 in FIG. 5) was performed once between these cycles, when a difference $\Delta V$ of the cell voltage exceeded 3V after having the battery a minute break after discharge, or when charge and discharge was repeated for 50 times. The battery capacity before starting this charge and discharge cycle and the capacity after performing 100 charge and discharge cycles were both measured. When the capacity retention rate was calculated, it was 95%.

Example 2

The test was performed under the same conditions as in Example 1, except for taking a 15-minute break and performing a control to discharge the battery up to 2V at the current density equivalent to 0.05 coulomb when the difference $\Delta V$ of the cell voltage still exceeded 3V after the break, after having the battery discharged up to 2V at the current density equivalent to 0.1 coulomb when a difference $\Delta V$ of the cell voltage exceeded 3V after having the battery a minute break after discharge during 100 charge and discharge cycles, or when charge and discharge was repeated for 50 times in Example 1. The battery capacity before starting this charge and discharge cycle and the capacity after 100 charge and discharge cycles were both measured. When the capacity retention rate was calculated, it was 96%.

Comparative Example 1

The test was performed under the same conditions as in Example 1, except for that the discharge processing in FIG. 5 of Example 1 was not performed. The battery capacity before starting this charge and discharge cycle and the capacity after 100 charge and discharge cycles were both measured. When the capacity retention rate was calculated, it was 25%.

From the results of Examples 1 and 2, and Comparative example 1, when compared to Comparative example 1 where discharge processing of step S6 in FIG. 5 was not performed, an improvement of 70% and more was confirmed in battery durability after 100 cycles in Examples 1 and 2 where discharge processing was performed. Further, from the results of Examples 1 and 2, it was also confirmed that capacity retention ratio improved a little more in Example 2 where discharge processing was performed multiple times.

As described above, according to the control device and control method of the secondary battery in the present embodiment, when a difference $\Delta V$ in the actual open circuit voltage value V of a secondary battery 10 is detected, the difference is eliminated by performing a discharge process to discharge completely. Thus, the difference in the state of charge value is eliminated even when the secondary battery 10 is charged at a constant voltage. As a result, overcharge can be prevented and thus an average voltage is also improved.

More, according to the control device and control method of the secondary battery in the present embodiment, a discharge rate in the discharge process is set to 1 coulomb or below so that discharge can be performed completely regardless of the intrinsic resistance of the constituent material in the secondary battery. This also helps to eliminate difference in the state of charge, thus battery overcharge can be prevented.

Further, according to the control device and control method of the secondary battery in the present embodiment, the discharge process is performed multiple times that even when discharge cannot be performed completely by a single discharge process, complete discharge is possible by performing the discharge process multiple times.

Also, according to the control device and control method of the secondary battery in the present embodiment, discharge rate is reduced in every discharge process during multiple discharge processes that even when discharge cannot be performed completely in the first discharge process due to greater value in discharge current than internal resistance of the secondary battery when compared, complete discharge is possible in subsequent discharge processes.

Moreover, according to the control device and control method of the secondary battery in the present embodiment, when a difference in the actual open circuit voltage value cannot be eliminated even after the discharge process is performed once or multiple times, the upper limit voltage value of charge for the secondary battery is lowered by the amount of predetermined value. As a result, overcharge can be prevented.

Also, according to the control device and control method of the secondary battery in the present embodiment, the discharge process is performed in accordance with the number of charge times regardless of difference determination for the actual open circuit voltage value. In such a way, the difference can be eliminated at a sign stage, that is when a difference is generated in the actual open circuit voltage value.

Further, according to the control device and control method of the secondary battery in the present embodiment, electric power discharged by the discharge process is stored in a stationary battery 90 or in another onboard battery 80 installed in the vehicle through an external charger. In this way, remaining electric power in the secondary battery 10 can be used effectively without waste.

Moreover, according to the control device and control method in the present embodiment, transition metal oxide containing solid solution lithium that can be represented as $Li_{1.5}[Ni_aCo_bMn_c[Li]_d]O_3$ is used as the solid solution material for the positive electrode active material, thus a secondary battery that enables high discharge capacity and capacity retention rate can be provided.

The voltage sensor 50 corresponds to the voltage detecting unit according to the present invention, the SOC detecting part 22 corresponds to the SOC detecting unit according to the present invention, the memory part 24 corresponds to the memory unit according to the present invention, the voltage difference determining part 26 corresponds to the presumed voltage calculating unit and determining unit according to the present invention, and the charge controller 20 corresponds to the control unit according to the present invention.

The invention claimed is:

1. A control device for a secondary battery using, as positive electrode material, positive electrode active material made of solid solution material, comprising:
    a voltage detecting unit configured to detect an actual open circuit voltage value of the secondary battery;
    a current detecting unit configured to detect an actual current value of the secondary battery;
    an SOC detecting unit configured to detect an actual state of charge value on a basis of the actual current value of the secondary battery;
    a memory unit configured to store a voltage-SOC standard control curve which shows a relation between an open circuit voltage value of the secondary battery and a state of charge value;
    a presumed voltage calculating unit configured to calculate a presumed voltage value on the basis of the actual state of charge value detected by the SOC detecting unit and the voltage-SOC standard control curve stored in the memory unit;
    a determining unit configured to determine a difference between the actual open circuit voltage value detected by the voltage detecting unit and the presumed voltage value calculated by the presumed voltage calculating unit; and
    a control unit configured to at least perform a discharge process so as to make the difference between the actual open circuit voltage value and the presumed voltage value smaller before a next charge process when the difference is determined higher than a predetermined range by the determining unit.

2. The control device as set forth in claim 1, wherein the determining unit determines the difference on the basis of whether a difference of the actual open circuit voltage value and the presumed voltage value is within a predetermined range or not.

3. The control device as set forth in claim 2, wherein the control unit:
    controls the secondary battery by using the actual open circuit voltage value when the determining unit determines that the difference of the actual open circuit voltage value and the presumed voltage value is within the predetermined range; and
    performs a discharge process so as to make the difference smaller before a next charge process when the determining unit determines that the difference of the actual open circuit voltage value and the presumed voltage value is not within the predetermined range.

4. The control device as set forth in claim 3, wherein the control unit sets an upper limit voltage value of the next charge process for a voltage value lower than a previous upper limit voltage value when the determining unit determines that the difference of the actual open circuit voltage value and the presumed voltage value after performing the discharge process is not within the predetermined range.

5. The control device as set forth in claim 3, wherein the control unit performs the discharge process in a case of performing a predetermined number of a charge process, regardless of a determined result by the determining unit.

6. The control device as set forth in claim 3, wherein the control unit performs to supply electric power generated by the discharge process to a stationary battery which is electrically connected via an external control device.

7. The control device as set forth in claim 3, wherein the control unit performs to supply electric power generated by the discharge process to another secondary battery which is mounted on a vehicle.

8. The control device as set forth in claim 1, wherein the control unit performs the discharge process at a discharge rate of 1 coulomb or less, the discharge rate of 1 coulomb being a current value a when a secondary battery having a nominal capacity of a is discharged by 1 hour.

9. The control device as set forth in claim 1, wherein the control unit performs a number of the discharge processes.

10. The control device as set forth in claim 9, wherein the control unit stepwise decreases a discharge rate in the discharge processes.

11. The control device as set forth in claim 1, wherein the solid solution material is a transition metal oxide containing solid solution lithium having a compositional formula of $Li_{1.5}[Ni_aCo_bMn_c[Li]_d]O_3$, in the compositional formula, Li denotes lithium, Ni denotes nickel, Co denotes cobalt, Mn denotes manganese and 0 denotes oxygen, a, b, c and d satisfy relationships: $0<a<1.4$; $0\leq b<1.4$; $0<c<1.4$; $0.1<d\leq 0.4$; $a+b+c+d=1.5$; and $1.1\leq a+b+c<1.4$,
    the transition metal oxide containing solid solution lithium includes a layered structure region and a region changed to a spinel structure by being subjected to charge or charge/discharge in a predetermined electrical potential range,
    a spinel structure change ratio of the transition metal oxide containing solid solution lithium is 0.25 or more to less than 1.0 when a ratio of an entire change from $Li_2MnO_3$ with the layered structure to $LiMn_2O_4$ with the spinel structure is defined to be 1.

12. A control method for a secondary battery using, as positive electrode material, positive electrode active material made of solid solution material, comprising:
    detecting an actual open circuit voltage value of the secondary battery;
    detecting an actual current value of the secondary battery;
    detecting an actual state of charge value on a basis of the actual current value of the secondary battery;
    storing a voltage-SOC standard control curve which shows a relation between an open circuit voltage value of the secondary battery and a state of charge value;
    calculating a presumed voltage value on the basis of the actual state of charge value detected by an SOC detecting unit and the voltage-SOC standard control curve stored by the storing step;
    determining a difference between the actual open circuit voltage value detected by the actual open circuit voltage detecting step and the presumed voltage value calculated by the presumed voltage calculating step; and at least performing a discharge process so as to make the difference between the actual open circuit voltage value and the presumed voltage value smaller before a next charge process when the difference is determined higher than a predetermined range.

\* \* \* \* \*